United States Patent [19]
Gotou

[11] Patent Number: 5,308,776
[45] Date of Patent: May 3, 1994

[54] METHOD OF MANUFACTURING SOI SEMICONDUCTOR DEVICE

[75] Inventor: Hiroshi Gotou, Kawasaki, Japan

[73] Assignee: Fujitsu Limited, Kawasaki, Japan

[21] Appl. No.: 837,265

[22] Filed: Feb. 18, 1992

[30] Foreign Application Priority Data

Feb. 20, 1991 [JP] Japan .................. 3-026510

[51] Int. Cl.⁵ ........................................... H01L 21/76
[52] U.S. Cl. ................................ 437/21 G; 437/62;
437/64; 437/67; 437/74; 437/141; 437/149;
437/154; 437/61; 148/DIG. 12; 148/DIG. 35
[58] Field of Search ............... 148/DIG. 12, DIG. 85,
148/DIG. 86, DIG. 30, DIG. 35; 437/141, 149,
154, 21, 62, 63, 67, 986, 61, 64, 74

[56] References Cited

U.S. PATENT DOCUMENTS 4,549,914  10/1985  Oh .................. 148/DIG. 35
4,826,787  5/1989   Muto et al. ............ 437/247

FOREIGN PATENT DOCUMENTS 59-55069   3/1984  Japan .
59-74676   4/1984  Japan .
63-54740   3/1988  Japan .
3-132055   6/1991  Japan .

OTHER PUBLICATIONS

Haisma, J., et al., "Silicon-on-Insulator Wafer Bonding... Evaluation", J. Journal Appl. Phys. vol. 28, No. 8 pp. 1426–1443 (1989).
"Wafer Bonding With Stress Free Trench Isolation", IBM Tech. Disc. Bull. vol. 34, No. 2, Jul. 1991, pp. 304–305.

Primary Examiner—George Fourson
Attorney, Agent, or Firm—Staas & Halsey

[57] ABSTRACT

A method of manufacturing an SOI type substrate by forming a poly-Si layer on the surface of the one Si single crystal wafer (A), then forming a SiO₂ film on the surface of the other Si single crystal wafer (B), bonding these wafers with each other, removing the end portion of the one Si single crystal wafer (A) by a polishing method leaving a part of this Si single crystal wafer as an element forming layer, providing a high concentration impurity region by selectively introducing impurity into the element forming layer and forming a high concentration impurity diffused region in the vicinity of interface with the poly-Si layer of the element forming layer by heat treatment; and a bipolar transistor formed on an SOI type substrate forming a high concentration impurity diffused region as a buried collector layer.

13 Claims, 5 Drawing Sheets

METHOD OF MANUFACTURING SOI SEMICONDUCTOR DEVICE

BACKGROUND OF THE INVENTION (1) Field of the Invention

The present invention relates to a method of manufacturing a semiconductor device formed on an SOI substrate and a semiconductor device formed by the same method, and particularly to a method of manufacturing semiconductor device including formation of high concentration impurity diffused region having a function which is the same as that of high concentration impurity buried region and a semiconductor device having the impurity diffused region.

As a semiconductor substrate on which an integrated circuit (IC) is formed, a substrate which is formed as a whole by a single crystal material is usually employed and moreover a substrate formed by providing a thin layer of a semiconductor single crystal (element forming layer) on an insulating layer is also used. In the case of latter substrate, a Si single crystal wafer is often used as a supporting substrate but such substrate is generally called an SOI (Silicon on Insulator) substrate irrespective of the substance of supporting substrate.

In case an IC is formed on an ordinary Si single crystal wafer, since an element and a substrate are separated by pn junction, this junction capacitance often impedes improvement of element characteristics. However, use of SOI substrate provides an advantage that since an element and a substrate are separated by an insulating layer, less influence of parasitic capacitance is generated and moreover adjacent elements are also separated and insulated easily.

But, formation of a high performance bipolar transistor on the SOI substrate results in the following problems. Namely, it is required for obtaining a high performance bipolar transistor to maintain a collector resistance within the required limit and therefore a buried layer having a low resistance is provided usually in the element forming layer in order to satisfy such requirement. However, in manufacturing of an SOI type IC, as will be explained later, since a substrate already forming a buried layer is used, arrangement of such buried layer cannot be set freely and thereby arrangement of elements is extensively restricted.

This problem becomes a large barrier particularly for manufacture of a bipolar type IC. Since, when free layout of transistor is attempted, a general purpose SOI substrate cannot be used, the manufacture must be started from fabrication of SOI substrate which requires extra time and cost. Therefore, it has strongly been requested to develop a method to intentionally form the buried layer in the SOI substrate having no buried layer.

(2) Description of the Related Art

As the most popular method to form a buried layer in a Si single crystal substrate, a high concentration region is formed to the predetermined position on the substrate surface by diffusing an impurity and an element forming layer is then grown thereon by the epitaxial growth method. This method has a merit that a buried layer can be formed in the desired position but allows increase of a couple of processes, namely the selective diffusion and epitaxial growth. Especially, in the SOI substrate, it is not an easy process to control the thickness of an epitaxial layer grown after the selective diffusion process to the required thickness, because the required element forming layer is frequently set to 1 $\mu$m or less.

In the conventional method of manufacturing the SOI substrate, two sheets of Si single crystal wafers (hereinafter, called only Si wafer) are bonded with each other through an oxide film. The processes to form an SOI substrate having buried layers by this method are schematically shown in FIGS. 1(a) to 1(d). As shown in FIG. 1(a), the buried layers 16 are formed at the surface of the one Si wafer 10 and moreover the $SiO_2$ film 12 is formed on the entire part of the surface thereof. (In this process, the buried layer 16 is yet impurity diffused region, but is so called for the convenience of explanation). Formation of such buried layer 16 is usually realized by the ion implantation method but moreover it can also be realized by gas diffusion or solid diffusion method. Thereafter, the $SiO_2$ film 12 is formed in the thickness of about 1 $\mu$m to the entire surface by the thermal oxidation process. The other Si single crystal wafer 11 to be bonded is also shown in FIG. 1(b).

As shown in FIG. 1(c), two sheets of Si wafers 10, 11 are stacked with the surface to which the buried layers 16 are formed provided inside and these wafers are bonded by the thermal process through the $SiO_2$ film 12. Next, as shown in FIG. 1(d), an SOI substrate having the buried layers 16 at the bottom part of the element forming layer 14 can be obtained by polishing the Si wafer 10 in the side of forming the buried layer to the predetermined thickness.

As explained above, the conventional method to form a SOI substrate having the buried layers includes the Si wafer polishing process. This process is generally different from a processing step called a wafer process and shows bad matching property with the other process. Therefore, it has been considered inadequate that such process is comprised into the IC manufacturing process. Namely, in manufacture of an SOI type IC, it is desirable that manufacture of SOI type substrate including the wafer polishing process is isolated from formation of buried layers.

SUMMARY OF THE INVENTION

It is an object of the present invention to provide a method of manufacturing an SOI type substrate for a high speed bipolar transistor, in which manufacture of SOI type substrate including the wafer polishing process is isolated from formation of buried layers and moreover the buried layers may be arranged in the optional positions.

It is another object of the present invention to provide a bipolar transistor which is formed on an SOI substrate having no buried regions and has the performance equivalent to that of a transistor having the buried type collector.

These objects are achieved by the manufacturing method and the semiconductor device explained hereunder.

A method of manufacturing an SOI type substrate comprising a process for forming a poly-Si layer on the surface of the one Si wafer (it is called a wafer A), a $SiO_2$ film on the surface of the other Si single crystal wafer (it is called a wafer B) and bonding the wafer A with the wafer B; a process for removing the edge portion of wafer A by a polishing method and leaving a part of the Si single crystal wafer A as an element forming layer; a process for selectively introducing an impurity into the element forming layer and providing a high concentration impurity region and a process for forming a high concentration impurity diffused region in the vicinity of interface with the poly-Si layer of the element forming layer by heat treatment; and a bipolar transistor providing the high concentration impurity diffused region as a buried collector layer.

FIG. 2 is a diagram for explaining the principle of the present invention. In FIG. 2, the numeral 1 denotes a supporting substrate generally formed by a Si single crystal; 2, a SiO$_2$ film; 3, a poly-Si layer; 4, an element forming layer formed by a Si single crystal. This SOI type substrate is manufactured by the independent bonding process and polishing process.

Thereafter, the n+ region 5 of the high impurity concentration region is formed by ion implantation of impurity atom such as arsenic (As) into the element forming layer 4. This n+ region 5 can be formed to the optional position of the element forming layer 4. In addition, the n+ region 5 may also be formed by gas diffusion or solid diffusion from ASG (arsenic silicate glass). When heat treatment is carried out at least partially for the purpose of activation of implanted impurity, As in the n+ region 5 diffuses to the poly-Si layer 3, but since diffusion velocity of impurity in the poly-Si layer 3 is an order of magnitude faster than that in the Si single crystal, impurity which has diffused laterally within the poly-Si layer 3 also diffuses again into the element forming layer 4 and thereby an n+ region 6 (a high concentration impurity diffused region) is also formed at the bottom part of the element forming layer 4.

In FIG. 2, the n+ region 6 at the bottom part of element forming layer 4 is connected with the n+ region 5 which is started from the substrate surface. Such structure is equivalent to the conventional structure where the buried layers are provided at the time of forming the SOI substrate.

Moreover, since the poly-Si layer generally has the gettering effect, heavy metal atoms in the element forming layer 4 is absorbed by the poly-Si layer 3. Therefore, characteristic of transistors, formed on the element forming layer 4 can be improved.

As explained above, according to the present invention, a high concentration impurity diffused region corresponding to the buried collector layer can be formed to the desired position, without adding the epitaxial growth process, on the SOI type substrate to which the buried layers are not provided previously. Thereby, a bipolar transistor having such buried collector layer can be manufactured, remarkably improving a degree of freedom in IC design. As a result, it also becomes possible to manufacture an SOI type IC providing high speed transistors.

DESCRIPTION OF THE PREFERRED EMBODIMENTS

Figure 1A:
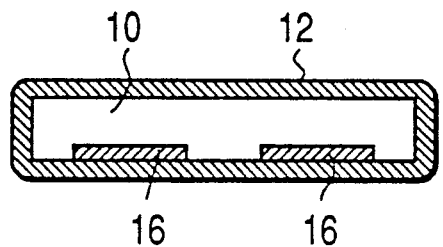
FIG. 1(a) is a diagram of a conventional Si wafer having buried layers covered with a SiO$_2$ film.
Figure 1B:
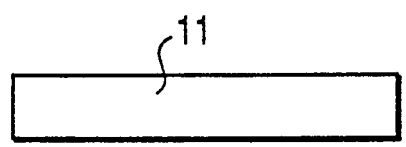
FIG. 1(b) is a diagram of another Si wafer to be bonded to the Si wafer of FIG. 1(a)
Figure 1C:
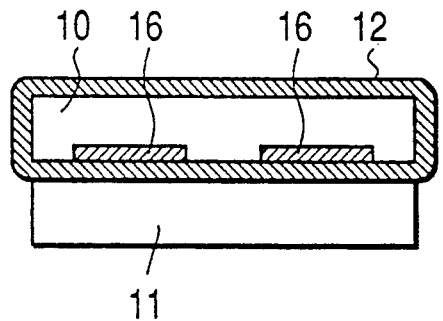
FIG. 1(c) is a diagram illustrating the conventional condition in which the Si wafer of FIG. 1(a) and the Si wafer of FIG. 1(b) are bonded through an SiO$_2$ film.
Figure 1D:
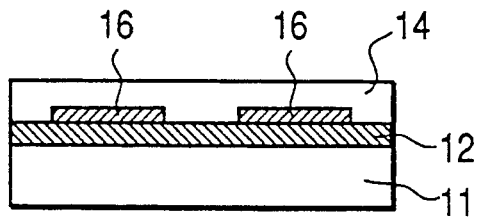
FIG. 1(d) is a diagram illustrating the conventional condition in which a part of the wafer in the side of forming the buried layers of FIG. 1(c) is removed by polishing, leaving the element forming layer and buried layers.
Figure 2:
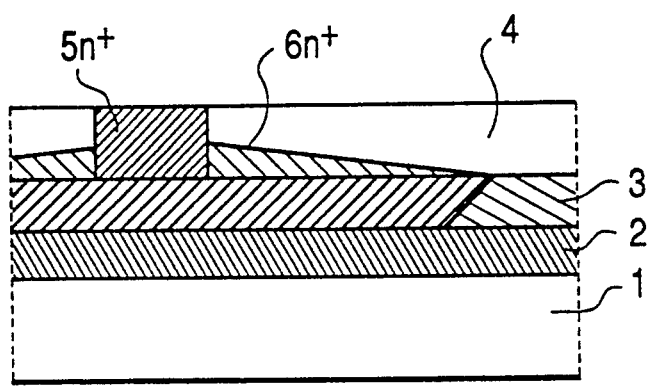
FIG. 2 is a diagram for explaining the principle of the present invention.

Six embodiments of the present invention will be explained with reference to the accompanying drawings. In these figures, the like reference numerals denote the like members or parts.

FIRST EMBODIMENT

In regard to this embodiment, a method of manufacturing an SOI type substrate of the present invention and a method of forming a high concentration impurity diffused region will be explained.

FIGS. 3(a) to 3(d) are schematic diagrams for explaining manufacturing steps for an SOI type substrate by the present invention.

Figure 3A:
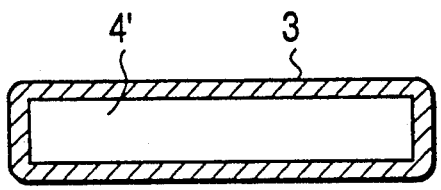
FIG. 3(a) is a diagram illustrating the condition in which a poly-Si layer is deposited on the surface of Si wafer.

As shown in FIG. 3(a), a poly-Si layer 3 is deposited in the thickness of about 0.1 μm on the surface of a Si wafer 4' by CVD (chemical vapor deposition) method. The Si wafer 4' used is an n-type wafer having a specific resistance of 1 Ω cm.

Figure 3B:
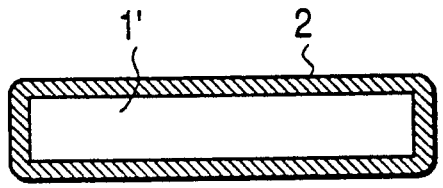
FIG. 3(b) is a diagram illustrating the condition in which a SiO$_2$ film is formed on the surface of another Si wafer.

As shown in FIG. 3(b), a SiO$_2$ film 2 in the thickness of about 0.1 μm is formed by the thermal oxidation method on the surface of the Si wafer 1' to be bonded to the Si wafer 4' of FIG. 3(a).

Figure 3C:
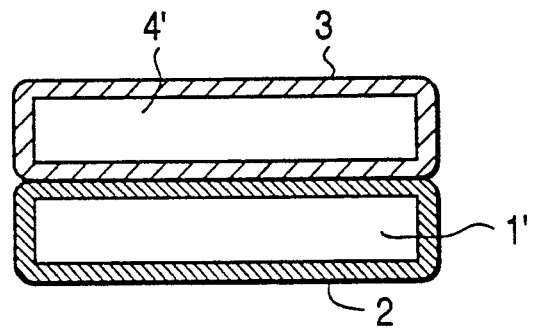
FIG. 3(c) is a diagram illustrating the condition in which the Si wafer of FIG. 3(a) and another Si wafer of FIG. 3(b) are bonded with each other through a ply-Si layer and SiO$_2$ film.

As shown in FIG. 3(c), the Si wafer 4' of FIG. 3(a) and the Si wafer 1' of FIG. 3(b) are sticked for the stacking and the heat treatment is carried out under the ordinary bonding condition.

Figure 3D:
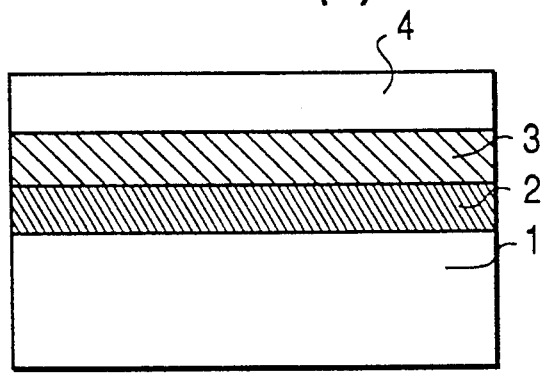
FIG. 3(d) is a diagram illustrating the condition in which a part of the Si wafer on which a poly-Si layer of FIG. 3(c) is removed by polishing, leaving the element forming layer and poly-Si layer.

As shown in FIG. 3(d), a part of the poly-Si layer 3 and the Si wafer 4' on the surface is removed by polishing the side of Si wafer 4' depositing the poly-Si layer 3, leaving the Si wafer 4' of the predetermined thickness (usually, 0.4 to 0.7 μm, but set to 0.4 μm in this embodiment) as the element forming layer 4. In this figure, the supporting substrate 1 is same as the Si wafer 1' of FIG. 3(c) but the SiO$_2$ film 2 of the bottom part and side surface is removed.

The SOI substrate of the present invention can be manufactured as explained above. Next, a high concentration impurity diffused region is formed on the element forming layer 4 of the SOI substrate explained above.

Figure 4:
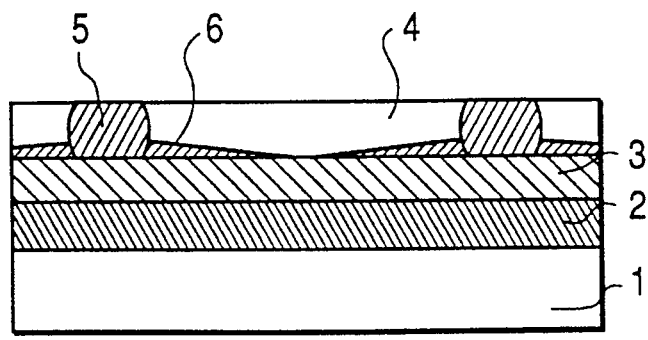
FIG. 4 is a diagram of an SOI device in a structure having a plurality of through n+ regions which are extended to the interface of poly-Si layer from the surface of a thin element forming layer and the n+ regions which connect such through n+ regions and are in contact with the interface.

As shown in FIG. 4, the As ion is implanted selectively to the element forming layer 4. As the implantation condition, an energy is determined as 100 KeV and dose is set to $1 \times 10^{16}$ cm$^{-2}$. Since the high concentration impurity diffused region is formed at the bottom part of the element forming layer 4, it is preferable to execute ion implantation to the deeper area of element forming layer 4.

Thereafter, the heat treatment is carried out for 120 minutes at 1100° C. under the nitrogen environment. As a result, the implanted arsenic As is activated and thereby the n+ region 5 is formed. Simultaneously, arsenic As is diffused in the lateral direction of the poly-Si layer 3 and is also diffused again into the element forming layer 4, allowing formation of n+ region 6 at the bottom part of the element forming layer 4. In this case, this n+ region is formed in plural numbers and when the selective ion implantation and heat treatment conditions are set so that the adjacent n+ regions are connected, the buried layers may be provided in wider element forming region.

Here, impurity is not doped into the poly-Si layer 3 of FIG. 3(a), but the effect of the present invention is further improved by previously doping impurity in a certain degree.

It is also possible to apply the amorphous Si layer in place of the poly-Si layer 3.

SECOND EMBODIMENT

Figure 5:
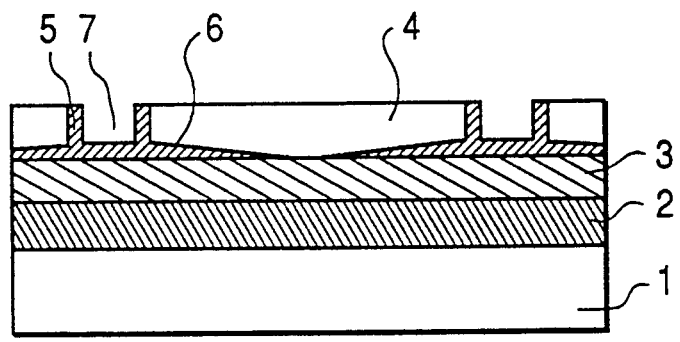
FIG. 5 is a diagram of an SOI device in a structure having a plurality of groove type n+ regions which are extended to the interface of poly-Si layer from the surface of a thick element forming layer and the n+ regions which connect such groove type n+ regions and are in contact with the interface.

This embodiment is a modification of the first embodiment. The manufacturing step of the SOI substrate in this embodiment is not explained here because it is similar to that of the first embodiment, except for that thickness of the element forming layer 4 is 0.7 μm. FIG. 5 is a schematic diagram for explaining a method to form a high concentration impurity diffused region to the element forming layer 4 of the SOI substrate.

As shown in FIG. 5, a groove (or indent) 7 in the depth of 0.5 μm is formed by executing the selective etching to the surface of element forming layer 4. Here, the arsenic As ion is selectively implanted to this groove 7 under the condition that an energy is 50 KeV and dose is $1 \times 10^{16}$ cm$^{-2}$.

Thereafter, the heat treatment is executed for 120 minutes at 1100° C. in the nitrogen environment. As a result, implanted As is activated and the n+ region 5 is formed. Simultaneously, arsenic As is diffused in the lateral direction of the poly-Si layer 3 and is also diffused again into the element forming layer 4, allowing formation of n+ region 6 at the bottom part of the element forming layer 4.

In this embodiment, since a region of the element forming layer to which the arsenic As ion is implanted substantially becomes thinner because the groove 7 is first formed, arsenic As is diffused as in the case of the embodiment 1, even in case thickness of the element forming layer is as thick as 0.7 μm.

Moreover, in this embodiment, the selective ion implantation has been employed to form the n+ region 5, but it is also possible use ASG (arsenic silicate glass) as an impurity source and utilize solid diffusion of arsenic As from this impurity source. In this case, since a mask for selective diffusion (usually, Si nitride film) can also be used as a selective etching mask in the groove 7 forming step, the number of times of masking is never increased.

THIRD EMBODIMENT

Figure 6:
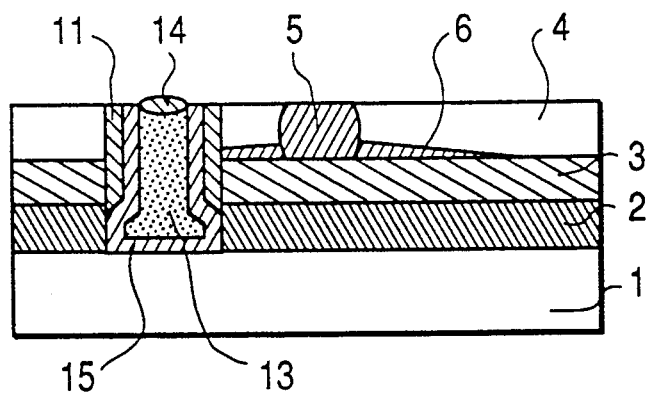
FIG. 6 is a diagram illustrating an SOI device in a structure having a n+ region restricted by a trench type isolation region.

This embodiment is also a modification of the first embodiment. The manufacturing step of the SOI substrate of the present invention is not explained here because it is basically same as that of the first and second embodiments. FIG. 6 is a schematic diagram for explaining a method to form a high concentration impurity diffused region to the element forming layer 4 of the SOI substrate including a trench type isolation region.

As shown in FIG. 6, a trench, which reaches the SiO$_2$ film 2 from the surface through the element forming layer 4 and poly-Si layer 3, is formed by the RIE (reactive ion etching) method. Next, a Si nitride film 15 is formed after the SiO$_2$ film 11 is formed to the Si exposed surface in the trench by the thermal oxidation method. Moreover, the inside of trench is filled with the poly-Si film 13 by the CVD method, the surface is then etched back and is oxidized, followed by formation of the SiO$_2$ film 14. Thereby, a trench type isolation region may be formed.

As explained above, the inside of trench is filled with the poly-Si film 13 but it may be replaced with other insulating material films.

Next, the element forming layer 4, n+ region 5 and n+ region 6 are formed on the SOI substrate including the trench type isolation region by the step similar to that of the first embodiment. In this case, since the poly-Si layer 3 is cut by the trench type isolation region, impurity diffusion through this layer is prevented by the trench type isolation region. Namely, in this third embodiment, a high concentration impurity diffused region forming range may be limited.

In above explanation, regions corresponding to the buried layers are formed after formation of the trench type isolation region, but the buried layers extending to the entire part of thereon defined by such isolating region can be formed by providing, as in the case of the first embodiment, the trench type isolation region after the buried layers are formed so that the adjacent n+ regions 6 are connected in the element forming layer 4.

FOURTH EMBODIMENT

Figure 7:
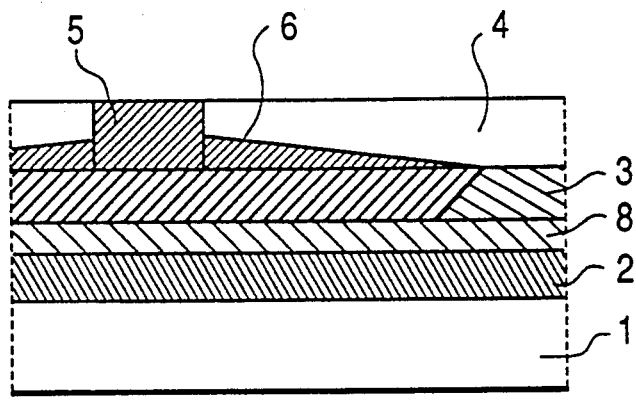
FIG. 7 is a diagram illustrating an SOI device providing a metal silicate layer between the poly-Si layer and SiO$_2$ film of FIG. 2.

This embodiment is a modification of a method of manufacturing the SOI type substrate in the embodiments explained above. As shown in FIG. 7, in the SOI type substrate, a SiO$_2$ film 2, a metal silicate layer 8, a poly-Si layer 3 and an element forming layer 4 are stacked on a supporting substrate 1. This SOI type substrate can be formed in the same steps as those of the first embodiment, only except for addition of the step that a film of metal such as Mo (molybdenum), W (tungsten), Pt (platinum), Ti (titanium), etc., is deposited on the surface of the poly-Si layer 3 of FIG. 3(a) to form a silicide.

A high concentration impurity diffused region can be formed using the SOI type substrate explained above as in the case of the embodiments 1, 2 and 3.

The step to form a high concentration impurity diffused region at the bottom part of the element forming layer is similar to that of the first embodiment. That is, the buried type n+ region 6 can be formed by forming the n+ region 5 by the As ion implantation and heat treatment and by quickly diffusing As atoms into the poly-Si layer 3 during the heat treatment and then diffusing again into the element forming layer 4.

According to the constitution of this embodiment, since a collector leadout resistance can be lowered independent of impurity concentration distribution of collector region of a bipolar transistor, a higher speed operation transistor may be attained.

In above four embodiments, arsenic As is used as impurity atom to form a high concentration impurity diffused region at the bottom part of the element forming layer, but it is also possible to use phosphorus (P), antimony (Sb), in place of arsenic As. Moreover, boron (B), aluminum (Al), gallium (Ga), etc., may be used to form a p-type high concentration impurity diffused region.

FIFTH EMBODIMENT

Figure 8A:
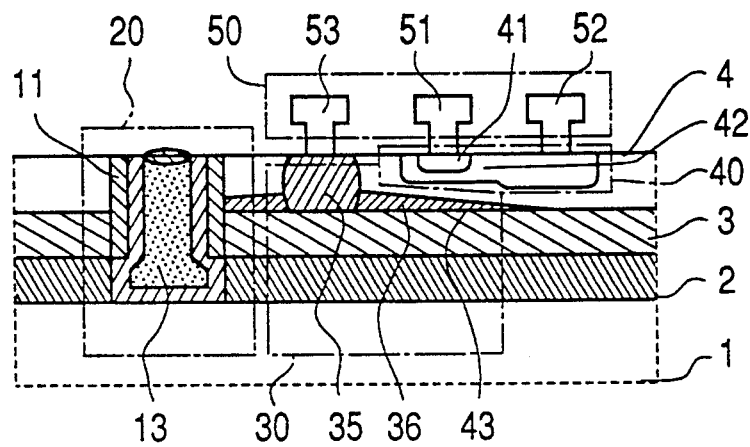
FIG. 8(a) is a side elevation of a bipolar transistor formed on the basis of the structure of FIG. 6.
Figure 8B:
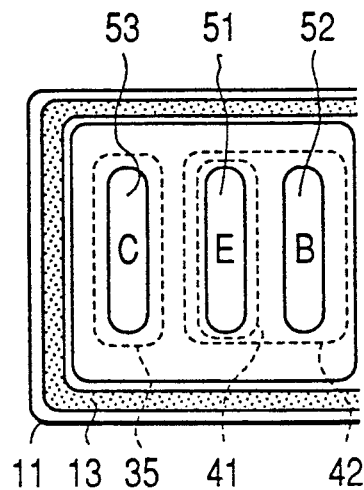
FIG. 8(b) is a plan view of a bipolar transistor of FIG. 8(a)

This embodiment refers to a bipolar transistor which is manufactured by a manufacturing method explained in regard to the first, second, third and fourth embodiments and the related arts. FIG. 8 is a schematic diagram illustrating a structure of the one bipolar transistor provided on the SOI type substrate by the present invention. FIG. 8(a) is a side elevation and FIG. 8(b) is a plan view of such bipolar transistor. In FIG. 8(a), a trench type isolation region provided in the section 20 enclosed by a chain line is formed by the method in regard to the third embodiment. Moreover, a high concentration impurity diffused region provided in the section 30 enclosed by a chain line is formed by the method in regard to the first embodiment. The n+ region 35 is the collector leadout region and the n+ region 36 at the bottom part of the element forming layer 4 corresponds to the buried layer for lowering a collector resistance. The section 40 enclosed by a chain line indicates a structure of an npn bipolar transistor to be formed by the well known methods. In this section, numeral 41 denotes an emitter; 42, a base; 43, a collector. The section 50 enclosed by a chain line indicates a contact electrode structure formed by the well known methods. The numeral 51 denotes an emitter electrode; 52, a base electrode; 53, a collector electrode.

As the SOI type substrate, it is also possible to use the SOI substrate of the fourth embodiment, in place of the SOI type substrate of this embodiment.

As can be understood from this embodiment, a bipolar transistor having the structure shown in FIG. 8 having the buried collector layer is formed on the SOI type substrate not including the buried layers.

SIXTH EMBODIMENT

Figure 9:
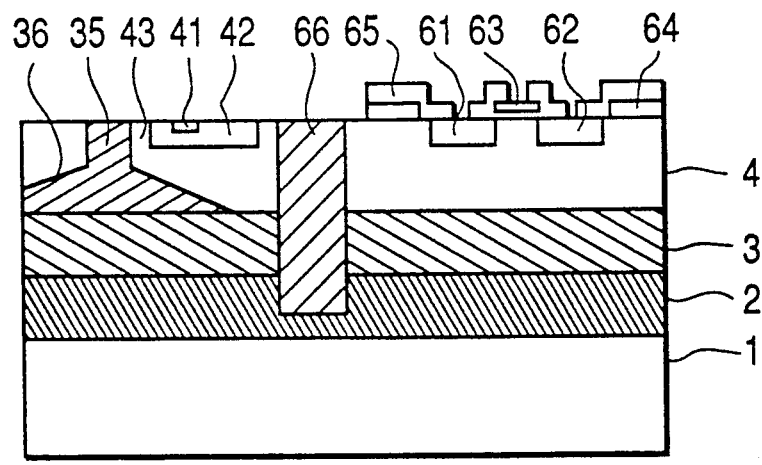
FIG. 9 is a diagram illustrating a bipolar transistor having the buried layers and an FET isolated by the trench type isolation region.

This embodiment refers to a semiconductor device in which a bipolar transistor having the buried collector and an ordinary FET (field effect transistor) are provided on the SOI substrate used in the first, second, third or fourth embodiment. FIG. 9 schematically shows a structure of this semiconductor device.

In FIG. 9, the numeral 1 denotes a supporting substrate which is generally formed by a Si single crystal; 2, a SiO$_2$ film; 3, a poly-Si layer; 4, an element forming layer formed by a Si single crystal; 35, a n+ region; 36, a n+ region; 41, 42, 43, emitter, base and collector of a bipolar transistor; 61, 62, 63, source, drain and gate of FET; 64, 65, an insulating film. The contact electrode of bipolar transistor and FET is not illustrated. These bipolar transistor and FET are isolated by the trench type isolation region 66.

What is claimed is:

1. A method of manufacturing an SOI device having a conductive impurity layer; said method comprising the steps of:
   (a) forming a non-single crystal silicon layer on the exterior of a first single crystal wafer and an insulating film on the exterior of a second single crystal wafer and thereafter bonding these first and second single crystal wafers with each other through said non-single crystal silicon layer and said insulating film;
   (b) removing by polishing a part of said non-single crystal silicon layer and a part of said first single crystal wafer from an end surface on a side of said first single crystal wafer, leaving a part of said first single crystal wafer as an element forming layer having an interface with said non-single crystal silicon layer;
   (c) selectively introducing impurity atoms into said element forming layer to provide a conductive impurity region at a first impurity concentration reaching said non-single crystal silicon layer;
   (d) forming a conductive impurity diffused region, having a second concentration lower than the first concentration, in said element forming layer and substantially extending to the interface between said element forming layer and said non-single crystal silicon layer, said conductive impurity diffused region formed by impurity diffusion from said conductive impurity region through said non-single crystal silicon layer at least, by using heat treatment; and
   (e) forming a transistor in a region between an exterior surface of said element forming layer and said conductive impurity diffused region.

2. A manufacturing method according to claim 1, said method further comprising the step of (f) providing a metal layer which forms a silicide on said non-single crystal silicon layer formed on said first silicon single crystal wafer.

3. A manufacturing method according to claim 1, said method further comprising the step of (f) selectively etching said element forming layer to selectively reduce the thickness of said element forming layer, where said conductive impurity region is formed in step (c), before said selectively introducing of the impurity atoms in step (c).

4. A manufacturing method according to claim 1, wherein said selectively introducing of the impurity atoms in step (c) forms a plurality of conductive impurity regions and said heat treatment in step (d) forms a plurality of conductive impurity diffused regions, and wherein steps (c) and (d) are controlled so that said conductive impurity diffused regions formed by impurity diffusion from said conductive impurity region are connected with each other.

5. A manufacturing method according to claim 1, said method further comprising the steps of:

(f) forming a trench which reaches said insulating film from the surface of said element forming layer through said element forming layer and said non-single crystal silicon layer; and (g) forming a trench isolation region by filling the inside of said trench with an insulating material.

6. A manufacturing method according to claim 1, wherein said insulating material includes, at least one material selected from the group consisting of a silicon oxide film, a silicon nitride film and a polysilicon layer.

7. A manufacturing method according to claim 5, wherein said trench type isolation region is formed in a position in contact with a part of said high concentration impurity diffused region.

8. A manufacturing method according to claim 1, wherein non-single crystal silicon layer is selected from the group consisting of a poly-silicon layer and an amorphous silicon layer.

9. A manufacturing method according to claim 1, wherein said insulating film on the surface of said second single crystal wafer is selected from the group consisting of a silicon oxide layer and a silicon nitride layer.

10. A manufacturing method according to claim 2, wherein said metal forming the silicide is selected from the group consisting of molybdenum (Mo), tungsten (W), platinum (Pt), and titanium (Ti).

11. A manufacturing method according to claim 1, wherein the impurity atoms introduced selectively in step (c) to form said conductive impurity region have a conductivity type matching that of said element forming layer.

12. A manufacturing method according to claim 1, wherein the impurity atoms are selectively introduced in step (c) by ion implantation to form said conductive impurity region.

13. A manufacturing method according to claim 1, wherein the thickness of said element forming layer is thinner than 1 $\mu$m.

* * * * *